US008766635B2

(12) United States Patent
Kidane et al.

(10) Patent No.: US 8,766,635 B2
(45) Date of Patent: Jul. 1, 2014

(54) SYSTEM AND APPARATUS FOR BALANCING RADIAL FORCES IN A GRADIENT COIL

(75) Inventors: Tesfaye K. Kidane, Florence, SC (US); Timothy J. Havens, Florence, SC (US); Longzhi Jiang, Florence, SC (US)

(73) Assignee: General Electric Company, Schenectady, NY (US)

( * ) Notice: Subject to any disclaimer, the term of this patent is extended or adjusted under 35 U.S.C. 154(b) by 418 days.

(21) Appl. No.: 13/183,647

(22) Filed: Jul. 15, 2011

(65) Prior Publication Data
US 2013/0002252 A1    Jan. 3, 2013

Related U.S. Application Data

(60) Provisional application No. 61/503,401, filed on Jun. 30, 2011.

(51) Int. Cl.
*G01V 3/00* (2006.01)
*G01R 33/385* (2006.01)

(52) U.S. Cl.
CPC ............................ *G01R 33/3854* (2013.01)
USPC .......................................... 324/318; 324/319

(58) Field of Classification Search
USPC .................... 324/318, 319, 320, 322
See application file for complete search history.

(56) References Cited

U.S. PATENT DOCUMENTS

| 4,812,797 | A | * | 3/1989 | Jayakumar | 335/299 |
|---|---|---|---|---|---|
| 5,278,504 | A | * | 1/1994 | Patrick et al. | 324/318 |
| 5,539,367 | A | * | 7/1996 | Xu et al. | 335/301 |
| 5,545,996 | A | * | 8/1996 | Morich et al. | 324/318 |
| 5,764,059 | A | * | 6/1998 | Mansfield et al. | 324/318 |
| 5,942,898 | A | | 8/1999 | Petropoulos et al. | |
| 6,492,816 | B1 | * | 12/2002 | Feenan | 324/318 |
| 6,822,452 | B2 | * | 11/2004 | Ham et al. | 324/320 |
| 7,030,610 | B2 | | 4/2006 | Mansfield | |
| 7,141,974 | B2 | | 11/2006 | Edelstein et al. | |
| 2008/0315878 | A1 | | 12/2008 | Ham | |

OTHER PUBLICATIONS

Search Report from GB Application No. 1211418.7 dated Feb. 8, 2013.
Search Report from GB Application No. 1211418.7, Oct. 18, 2012.

* cited by examiner

*Primary Examiner* — Louis Arana

(57) ABSTRACT

A gradient coil apparatus for a magnetic resonance imaging (MRI) system includes an inner gradient coil assembly and an outer gradient coil assembly disposed around the inner gradient coil assembly. The outer gradient coil assembly has an outer surface, a first end and a second end. The gradient coil apparatus also includes a force balancing apparatus disposed around the outer surface of the outer gradient coil assembly. In one embodiment, the force balancing apparatus includes an active force balancing coil disposed around the outer surface of the outer gradient coil assembly. In another embodiment, the force balancing apparatus includes a first passive conducting strip disposed around the first end of the outer gradient coil assembly and a second passive conducting strip disposed around the second end of the outer gradient coil assembly.

15 Claims, 4 Drawing Sheets

SYSTEM AND APPARATUS FOR BALANCING RADIAL FORCES IN A GRADIENT COIL

CROSS REFERENCE TO RELATED APPLICATION

The present application claims the benefit of U.S. Provisional Application Ser. No. 61/503,401, filed Jun. 30, 2011, herein incorporated by reference in its entirety.

FIELD OF THE INVENTION

The present invention relates generally to a magnetic resonance imaging (MRI) system and in particular to a system and apparatus for balancing radial forces in a gradient coil in an MRI system.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

The gradient coil assembly used in an MRI system may be a shielded gradient coil assembly that consists of inner and outer gradient coil assemblies bonded together with a material such as epoxy resin. Typically, the inner gradient coil assembly includes inner (or main) coils of X-, Y-, and Z-gradient coil pairs or sets and the outer gradient coil assembly includes the respective outer (or shielding) coils of the X-, Y- and Z-gradient coil pairs or sets. The Z-gradient coils are typically cylindrical with a conductor spirally wound around the cylindrical surface. The transverse X- and Y-gradient coils are commonly formed from a copper panel with an insulating backing layer. A conductor turn pattern (e.g., a fingerprint pattern) may be cut in the copper layer of the gradient coil.

During an MRI scan, acoustic noise and vibration can be generated by the MRI system. The acoustic noise and vibration can be uncomfortable and potentially harmful to both the patient and the scanner operator. There are several sources of acoustic noise in an MRI system including, for example, the gradient coils and the RF body coil. The acoustic noise may be generated by the vibration of the gradient coils when the coils are pulsed during imaging operation. Gradient coil vibration is created by forces applied to the gradient coil as a result of the interaction of the static magnetic field and the electrical currents in the gradient coil to create the desired field. While the net radial force on the gradient coil assembly can be zero, each half of the gradient coil cylinder can experience a large radial force. These radial forces result in vibration of each half of the gradient coil cylinder which can result in the excitement of some acoustic modes (e.g., fish mode, banana mode, etc.). In addition, the vibration of the gradient coil assembly can result in Helium boil off in the magnet cryostat.

It would be desirable to provide a system and apparatus for balancing the radial forces in a gradient coil to reduce vibration and acoustic noise.

BRIEF DESCRIPTION OF THE INVENTION

In accordance with an embodiment, a gradient coil apparatus for a magnetic resonance imaging (MRI) system includes an inner gradient coil assembly, an outer gradient coil assembly disposed around the inner gradient coil assembly and having an outer surface and an active force balancing coil disposed around the outer surface of the outer gradient coil assembly.

In accordance with another embodiment, a gradient coil apparatus for a magnetic resonance imaging (MRI) system includes an inner gradient coil assembly, an outer gradient coil assembly disposed around the inner gradient coil assembly and having an outer surface, a first end and a second end, a first passive conducting strip disposed around the first end of the outer gradient coil assembly, and a second passive conducting strip disposed around the second end of the outer gradient coil assembly.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
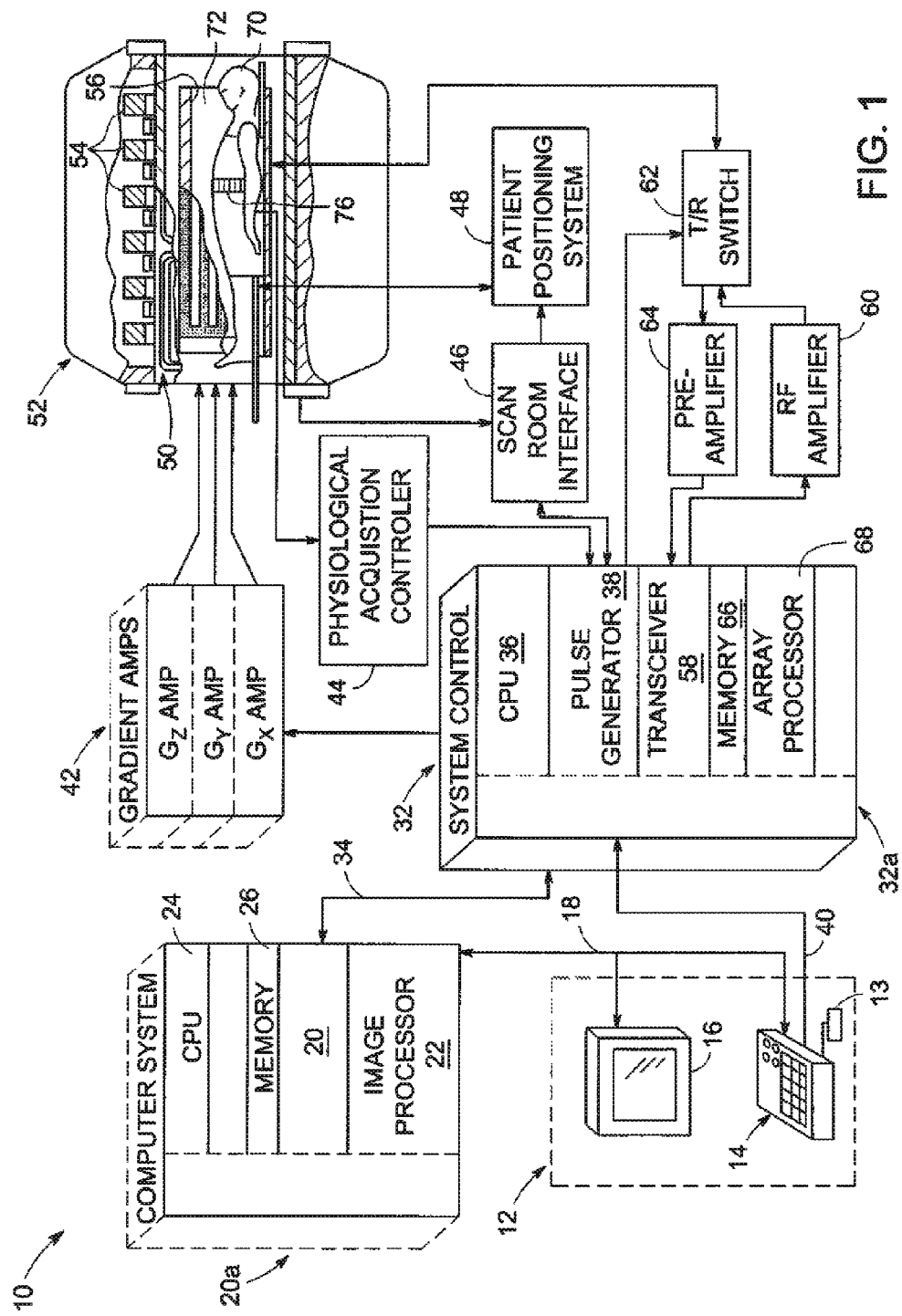
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$, and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 or parallel or surface coil 76 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
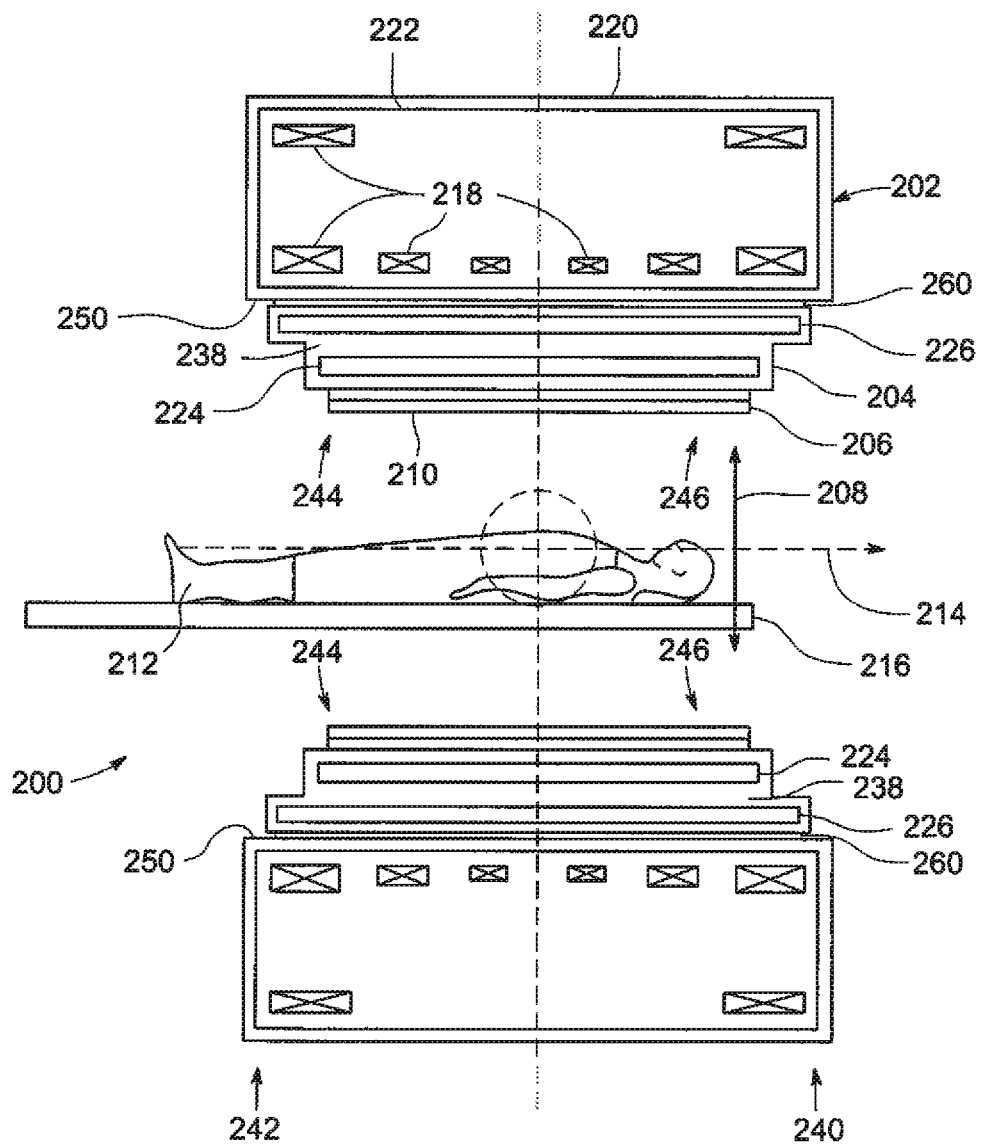
FIG. 2 is a schematic side elevation view of a resonance assembly in accordance with an embodiment.

FIG. 2 is a schematic side elevation view of a resonance assembly in accordance with an embodiment. Resonance assembly 200 may be used in an MRI system such as MRI system 10 shown in FIG. 1. The resonance assembly 200 is cylindrical in shape and includes, among other elements, a superconducting magnet 202, a gradient coil assembly 204 and a RF coil 206. Various other elements such as covers, supports, suspension members, end caps, brackets, etc. are omitted from FIG. 2 for clarity. A cylindrical patient volume or bore 208 is surrounded by a patient bore tube 210. RF coil 206 is cylindrical and is disposed around an outer surface of the patient bore tube 210 and mounted inside the cylindrical gradient coil assembly 204. The gradient coil assembly 204 is disposed around the RF coil 206 in a spaced apart coaxial relationship and the gradient coil assembly 204 circumferentially surrounds the RF coil 206. Gradient coil assembly 204 is mounted inside a warm bore 250 of the magnet 202 and is circumferentially surrounded by magnet 202.

A patient or imaging subject 212 may be inserted into the resonance assembly 200 along a center axis (e.g., a Z-axis) 214 on a patient table or cradle 216. The patient table or cradle 216 is inserted into the resonance assembly at a "patient end" 242 of the resonance assembly and the opposing end is a "service end" 240. Center axis 214 is aligned along the tube axis of the resonance assembly 200 parallel to the direction of the main magnetic field, BO, generated by the magnet 202. RF coil 206 may be used to apply a radio frequency pulse (or a plurality of pulses) to a patient or subject 212 and may be used to receive MR information back from the subject 212 as is well known in the field of MR imaging. Gradient coil assembly 204 generates time dependent gradient magnetic pulses that are used to spatially encode points in the imaging volume in a known manner.

Superconducting magnet 202 may include, for example, several radially aligned and longitudinally spaced apart superconductive coils 218, each capable of carrying a large current. The superconductive coils 218 are designed to create a magnetic field, BO, within the patient volume 208. The superconductive coils 218 are enclosed in a cryogen environment within a cryogenic envelope 222. The cryogenic environment is designed to maintain the temperature of the superconducting coils 218 below the appropriate critical temperature so that the superconducting coils 218 are in a superconducting state with zero resistance. Cryogenic envelope 222 may include, for example, a helium vessel (not shown) and thermal or cold shields (not shown) for containing and cooling magnet windings in a known manner. Superconducting magnet 202 is enclosed by a magnet vessel 220, e.g., a cryostat vessel. Magnet vessel 220 is configured to maintain a vacuum and to prevent heat from being transferred to the cryogenic envelope 222. A warm bore 250 is defined by an inner cylindrical surface of the magnet vessel 220.

Gradient coil assembly 204 is a self-shielded gradient coil assembly. Gradient coil assembly 204 comprises a cylindrical inner gradient coil assembly or winding 224 and a cylindrical outer gradient coil assembly or winding 226 disposed in a concentric arrangement with respect to a common axis 214. Inner gradient coil assembly 224 includes inner (or main) X-, Y- and Z-gradient coils and outer gradient coil assembly 226 includes the respective outer (or shielding) X-, Y- and Z-gradient coils. The coils of the gradient coil assembly 204 may be activated by passing an electric current through the coils to generate a gradient field in the patient volume 208 as required in MR imaging. A volume 238 or space between inner gradient coil assembly 224 and outer gradient coil assembly 226 may be filled with a bonding material, e.g., epoxy resin, visco-elastic resin, polyurethane, etc. Alternatively, an epoxy resin with filler material such as glass beads, silica and alumina may be used as the binding material. It should be understood that magnet and gradient topologies other than the cylindrical assemblies described above with respect to FIGS. 1 and 2 may be used. For example, a flat gradient geometry in a split-open MRI system may also utilize embodiments of the invention as described below.

Figure 3:
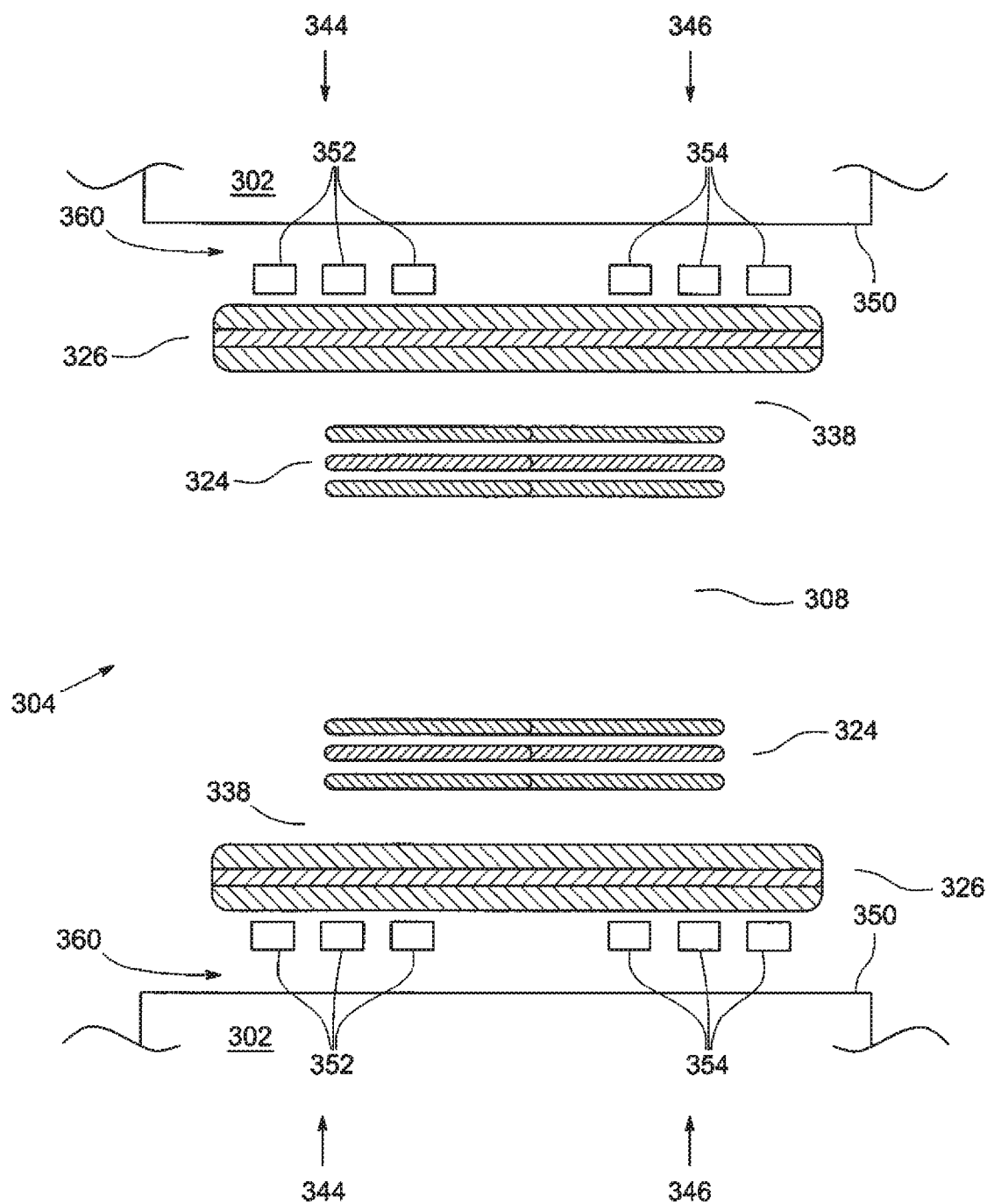
FIG. 3 is a schematic cross-sectional side view of a shielded gradient coil assembly in accordance with an embodiment.

An assembly or apparatus configured to balance radial forces on a first end (or half) 244 and a second end (or half) 246 of the gradient coil assembly 204 may be positioned in a gap or space 260 between the outer gradient coil assembly 226 and the magnet warm bore 250 and around an outer diameter of the outer gradient coil assembly 226 as described in more detail below with respect to FIGS. 3 and 4. FIG. 3 is a schematic cross-sectional side view of a shielded gradient coil assembly in accordance with an embodiment. Various elements such as supports, suspension members, end caps, brackets, etc. are omitted from FIG. 3 for clarity. Gradient coil assembly 304 may be inserted into a resonance assembly of an MRI system such as resonance assembly 100 shown in FIG. 2.

As described above, gradient coil assembly 304 is cylindrical and surrounds a patient volume or bore 308. The gradient coil assembly 304 includes an inner gradient coil assembly 324 and an outer gradient coil assembly 326. The inner gradient coil assembly 324 and the outer gradient coil assembly 326 are bonded together using a bonding material (for example, epoxy resin, visco-elastic resin, polyurethane, etc.) in a volume 338. Gradient coil assembly 304 also includes a force balancing layer positioned outside an outer diameter of the outer gradient coil assembly 326 and in a gap or space 360 between the outer gradient coil assembly 326 and warm bore 350 of a magnet assembly 302. The force balancing layer is configured to cancel (or null) the radial forces on each end (or half) 344, 346 of the gradient coil assembly 304. The force cancelation will reduce the vibration of each end (or half) 344, 346 of the cylindrical gradient coil assembly 304. The reduction in vibration will in turn reduce the acoustic noise generated by the gradient coil assembly 304. In addition, the reduction in vibration will also reduce the vibration induced Helium boil-off in the magnet cryostat 220 (shown in FIG. 2).

In the embodiment shown in FIG. 3, the force balancing layer is an active force balancing layer and includes a set of active coil loops 352 at a first end (or half) 344 of the gradient coil assembly 304 and a set of active coil loops 354 at a second end (or half) 346 of the gradient coil assembly 304. The active coil loops 352, 354 are disposed around an outer diameter (or outer surface) of the outer gradient coil assembly 326 cylinder. In an embodiment, layers of an insulating material (e.g., glass) are placed between an outer surface of the outer gradient coil assembly 326 and the active coil loops 352 and 354. In addition, an epoxy layer may be disposed on the active coil loops 352, 354 in a known manner.

The set of active coil loops 352 positioned at the first end 344 of the gradient coil assembly 304 are configured to cancel the radial forces applied to the first end 344 during operation of the gradient coil assembly 304 and MR system. The set of active coil loops 354 positioned at the second end 346 of the gradient coil assembly 304 are configured to cancel the radial forces applied to the second end 346 during operation of the gradient coil assembly 304 and MR system. Current in the active coil loops 352, 354 provide forces in an opposite direction to cancel the radial forces on the respective end 344, 346 of the gradient coil assembly 304. The location of the active coil loops 352, 354 and the number of active coils loops 352, 354 (or number of turns) may be based on a number of factors including, but not limited to, the force distribution on the gradient coil assembly 304 (and on the ends 344, 346) and the design of the magnet 302 and gradient coil assembly 304. The active coil loops 352, 354 may be made of a material such as copper.

In one embodiment, the active coil loops 352 and active coil loops 354 may be connected in series with the gradient coils of the gradient coil assembly 304 and driven (e.g., current provided) by a gradient amplifier system 42 (shown in FIG. 1). In an alternative embodiment, the active coil loops 352, 354 may be driven separately from the gradient coils of the gradient coil assembly 304. For example, a separate terminal from the gradient amplifier system 42 (shown in FIG. 1) may be connected to the active coil loops 352, 354.

Figure 4:
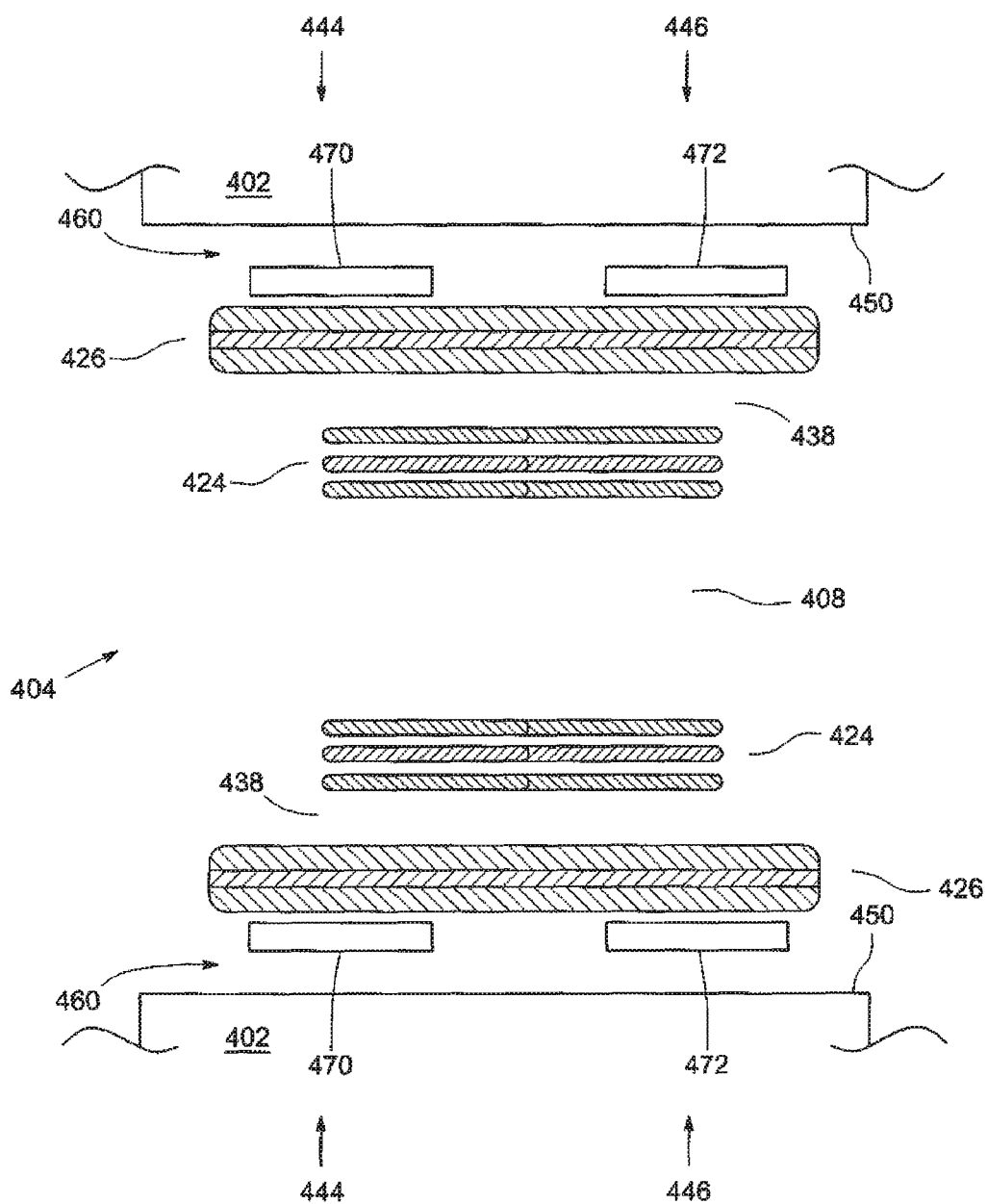
FIG. 4 is a schematic cross-sectional side view of a shielded gradient coil assembly in accordance with an embodiment.

FIG. 4 is a schematic cross-sectional side view of a shielded gradient coil assembly in accordance with an alternative embodiment. Various elements such as supports, suspension members, end caps, brackets, etc. are omitted from FIG. 3 for clarity. Gradient coil assembly 404 may be inserted into a resonance assembly of an MRI system such as resonance assembly 100 shown in FIG. 2. As described above, gradient coil assembly 404 is cylindrical and surrounds a patient volume or bore 408. The gradient coil assembly 404 includes an inner gradient coil assembly 424 and an outer gradient coil assembly 426. The inner gradient coil assembly 424 and the outer gradient coil assembly 426 are bonded together using a bonding material in a volume 438. Gradient coil assembly 404 also includes a force balancing layer positioned outside an outer diameter of the outer gradient coil assembly 426 and in a gap or space 460 between the outer gradient coil assembly 426 and warm bore 450 of a magnet assembly 402. The force balancing layer is configured to cancel (or null) the radial forces on each end (or half) 444, 446 of the gradient coil assembly 404.

In the embodiment shown in FIG. 4, the force balancing layer is a passive force balancing layer and includes a passive conducting strip 470 at a first end (or half) 444 of the gradient coil assembly 404 and a passive conducting strip 472 at a second end (or half) 446 of the gradient coil assembly 404. The passive conducting strips 470, 472 are disposed around an outer diameter (or outer surface) of the outer gradient coil assembly 426 cylinder. In an embodiment, layers of an insulating material (e.g., glass) are placed between an outer surface of the outer gradient coil assembly 426 and the passive conducting strips 470, 472. In addition, an epoxy layer may be disposed on the passive conducting strips 470, 472 in a known manner.

The passive conducting strip 470 positioned at the first end 444 of the gradient coil assembly 404 is configured to cancel the radial forces applied to the first end 444 during operation of the gradient coil assembly 404 and MR system. The passive conducting strip 472 positioned at the second end 446 of the gradient coil assembly 404 is configured to cancel the radial forces applied to the second end 446 during operation of the gradient coil assembly 404 and MR system. Current induced in the passive conducting strips 470, 472 provide the required forces in an opposite direction to cancel the radial forces on the respective end 444, 446 of the gradient coil assembly 404. The location of the passive conducting strips 470, 472 and the size and dimensions of the passive conducting strips 470, 472 may be based on a number of factors including, but not limited to, the force distribution on the gradient coil assembly 404 (and on the ends 444, 446) and the design of the magnet 402 and gradient coil assembly 404. In an embodiment, the passive conducting strips 470, 472 are positioned at a location of high leakage field. Preferably, the passive conducting strips are made of copper.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A gradient coil apparatus for a magnetic resonance imaging (MRI) system, the gradient coil apparatus comprising:
   an inner gradient coil assembly;
   an outer gradient coil assembly disposed around the inner gradient coil assembly and having an outer surface, wherein the outer gradient coil assembly further comprises a first end and a second end; and
   a first active force balancing coil disposed around a circumference of the first end of the outer surface of the outer gradient coil assembly and a second active force balancing coil disposed around a circumference of the second end of the outer surface of the outer gradient coil assembly, wherein the first and second active force balancing layers do not overlap.

2. A gradient coil apparatus according to claim 1, wherein each of the active force balancing coils are configured to cancel a radial force applied to the inner and outer gradient coil assembly.

3. A gradient coil apparatus according to claim 2, wherein a position of the active force balancing coils on the outer surface of the outer gradient coil assembly is based on a force distribution on the inner and outer gradient coil assembly.

4. A gradient coil apparatus according to claim 1, wherein the active force balancing coils are composed of a conducting material.

5. A gradient coil assembly according to claim 1, wherein the first active force balancing coil is configured to cancel a radial force applied to the first end of the outer gradient coil assembly.

6. A gradient coil apparatus according to claim 1, wherein the second active force balancing coil is configured to cancel a radial force applied to the second end of the outer gradient coil assembly.

7. A gradient coil apparatus according to claim 1, wherein the outer gradient coil comprises a middle portion between the first end portion and the second end portion that is not surrounded by either of the first or second active force balancing coils.

8. A gradient coil apparatus for a magnetic resonance imaging (MRI) system, the gradient coil apparatus comprising:
   an inner gradient coil assembly;
   an outer gradient coil assembly disposed around the inner gradient coil assembly and having an outer surface, a first end and a second end,
   a first passive conducting strip disposed around a circumference of the first end of the outer surface of the outer gradient coil assembly; and
   a second passive conducting strip disposed around a circumference of the second end of the outer surface of the outer gradient coil assembly.

9. A gradient coil apparatus according to claim 8, wherein the first passive conducting strip is configured to cancel a radial force applied to the first end of the outer gradient coil assembly.

10. A gradient coil apparatus according to claim 8, wherein the second passive conducting strip is configured to cancel a radial force applied to the second end of the outer gradient coil assembly.

11. A gradient coil apparatus according to claim 8, wherein the first passive conducting strip is positioned at a location on the first end of the outer gradient coil assembly having a high leakage field.

12. A gradient coil apparatus according to claim 8, wherein the second passive conducting strip is positioned at a location on the second end of the outer gradient coil assembly having a high leakage field.

13. An apparatus according to claim 8, wherein the first passive conducting strip and the second passive conducting strip are composed of copper.

14. An apparatus according to claim 8, wherein a position of the first passive conducting strip is based on a force distribution on the first end of the outer gradient coil assembly.

15. An apparatus according to claim 8, wherein a position of the second passive conducting strip is based on a force distribution on the second end of the outer gradient coil assembly.

* * * * *